United States Patent
Ri et al.

(10) Patent No.: US 12,048,966 B2
(45) Date of Patent: Jul. 30, 2024

(54) INSERT AND CUTTING TOOL INCLUDING THE SAME

(71) Applicant: KYOCERA CORPORATION, Kyoto (JP)

(72) Inventors: Kou Ri, Satsumasendai (JP); Tadashi Katsuma, Satsumasendai (JP); Takumi Hashimoto, Kagoshima (JP)

(73) Assignee: KYOCERA CORPORATION, Kyoto (JP)

( * ) Notice: Subject to any disclaimer, the term of this patent is extended or adjusted under 35 U.S.C. 154(b) by 568 days.

(21) Appl. No.: 17/433,995

(22) PCT Filed: Feb. 25, 2020

(86) PCT No.: PCT/JP2020/007410
§ 371 (c)(1),
(2) Date: Aug. 25, 2021

(87) PCT Pub. No.: WO2020/175459
PCT Pub. Date: Sep. 3, 2020

(65) Prior Publication Data
US 2022/0134445 A1 May 5, 2022

(30) Foreign Application Priority Data
Feb. 26, 2019 (JP) ................ 2019-032892

(51) Int. Cl.
| | | |
|---|---|---|
| *B23B 27/16* | (2006.01) | |
| *C23C 16/30* | (2006.01) | |
| *C23C 16/34* | (2006.01) | |
| *C23C 16/36* | (2006.01) | |
| *C23C 16/40* | (2006.01) | |

(52) U.S. Cl.
CPC ........ *B23B 27/1611* (2013.01); *C23C 16/308* (2013.01); *C23C 16/34* (2013.01); *C23C 16/36* (2013.01); *C23C 16/403* (2013.01)

(58) Field of Classification Search
None
See application file for complete search history.

(56) References Cited

FOREIGN PATENT DOCUMENTS

JP 200348106 A 2/2003

OTHER PUBLICATIONS

Machine translation from EPO of JP2003048106 (translated May 7, 2024) (Year: 2003).*

* cited by examiner

*Primary Examiner* — Elizabeth Collister
(74) *Attorney, Agent, or Firm* — HAUPTMAN HAM, LLP

(57) ABSTRACT

An insert of the present disclosure includes a base. The base includes a first surface, a second surface connecting to the first surface, and a cutting edge located on at least a part of a ridgeline of the first surface and the second surface. A region within 2.0 mm from the cutting edge in the first surface is a surface region A. A region within 0.5 mm from the surface region A is a region A1. A region within 1.2 mm from the surface region A and the second surface to 2.0 mm from the surface region A and the second surface is a region A2. An area ratio of vacancies in the region A1 is 0.005-0.04 area %, and an area ratio of vacancies in the region A2 is 0.05-0.2 area %. A cutting tool includes a holder including a pocket and the insert located in the pocket.

6 Claims, 3 Drawing Sheets

INSERT AND CUTTING TOOL INCLUDING THE SAME

CROSS-REFERENCE TO RELATED APPLICATION

The present application is a National Phase of International Application No. PCT/JP2020/007410, filed Feb. 25, 2020, and claims priority based on Japanese Patent Application No. 2019-032892, filed Feb. 26, 2019.

TECHNICAL FIELD

The present disclosure relates to an insert and a cutting tool including the insert.

BACKGROUND

An insert has been known which uses, as a base, cemented carbide, cermet, ceramics or like. The insert is used as a cutting tool by being fixed to a holder.

With improved efficiency in the recent cutting processes, inserts tend to be increasingly used in, for example, a heavy intermittent cutting process during which a cutting edge is subjected to a large impact. Under such severe cutting conditions, the cutting edge may be subjected to the large impact and may be prone to chipping. Hence, the inserts need improvement in terms of fracture resistance.

As a technology for improving the fracture resistance in the above insert, Patent Document 1 may disclose the technology for forming a porous band region part where vacancies are present in an amount of 5-30 area %, while ensuring that the vacancies are present in an amount of 2 area % or less in other parts by measurement under a longitudinal structure observation with an optical microscope. The porous band region part is formed at a depth of 20-100 μm from a surface in a rake surface part including a cutting edge ridgeline part where a rake surface intersects with a flank surface.

RELATED ART DOCUMENTS

Patent Document

Patent Document 1: Japanese Unexamined Patent Publication No. 2003-48106

SUMMARY

An insert of the present disclosure includes a base. The base includes a first surface, a second surface connecting to the first surface, and a cutting edge located on at least apart of a ridgeline of the first surface and the second surface. A region within 2.0 mm from the cutting edge in the first surface is a surface region A. A region which includes the surface region A and is within 0.5 mm from the surface region A is a region A1. A region within 1.2 mm from the surface region A and the second surface to 2.0 mm from the surface region A and the second surface is a region A2. An area ratio of vacancies in the region A1 is 0.005-0.04 area %, and an area ratio of vacancies in the region A2 is 0.05-0.2 area %.

A cutting tool of the present disclosure includes a holder which has a length ranging from a first end to a second end and comprises a pocket located on a side of the first end, and the insert located in the pocket.

EMBODIMENT

<Inserts>

Figure 1:
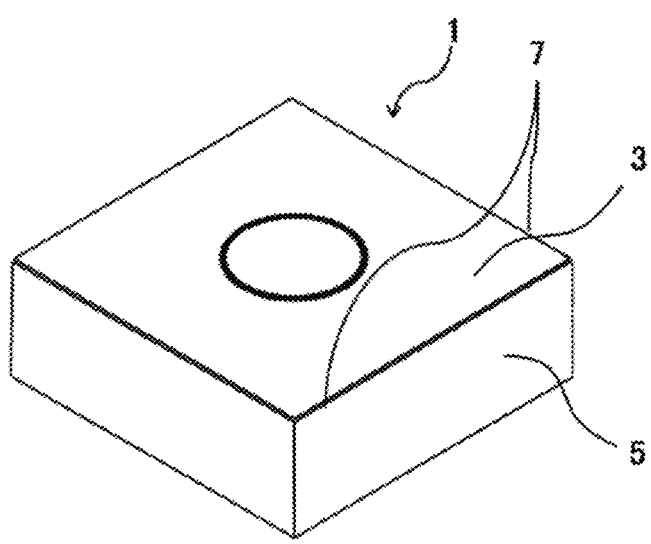
FIG. 1 is a schematic perspective view illustrating an embodiment of inserts of the present disclosure.

As illustrated in FIG. 1, an insert 1 of the present disclosure includes a base 9. The base 9 includes a first surface 3 (hereinafter also referred to as a main surface 3), a second surface 5, and a cutting edge 7 located on at least a part of an intersecting part (ridgeline) of the first surface 3 and the second surface 5. The first surface 3 is the surface called as a rake surface, and the second surface 5 is the surface called as a flank surface. It can therefore be said that the cutting edge 7 is located on at least the part of the intersecting part of the rake surface 3 and the flank surface 5. Although FIG. 1 illustrates the embodiment that the main surface 3 has an approximately quadrangular plate shape, no limitation may be imposed on the shape of the insert.

Figure 2:
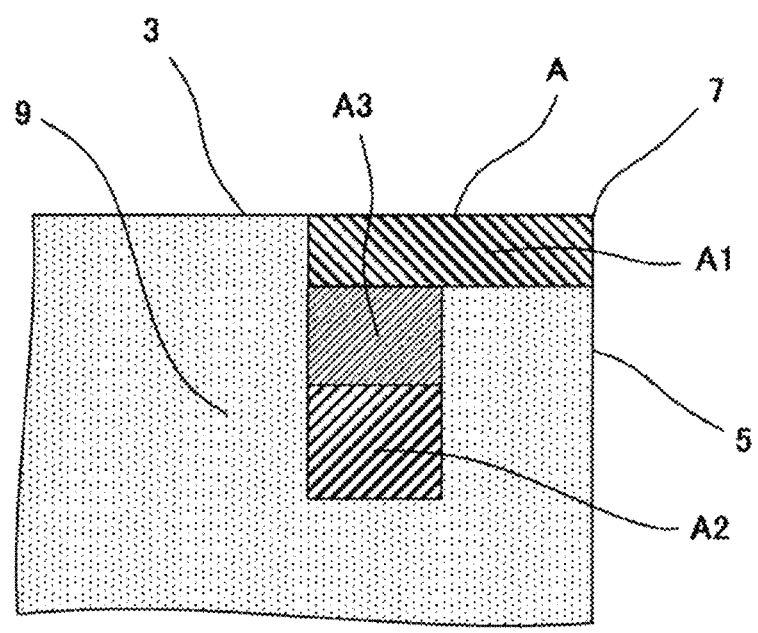
FIG. 2 is a schematic diagram for describing a configuration of a cross section of a base of the insert in FIG. 1.

FIG. 2 illustrates an enlarged view of a cross section of the base 9 perpendicular to the first surface 3 in the vicinity of the cutting edge 7 of the insert 1 in the present disclosure.

A region located within 2 mm from the cutting edge 7 in the first surface 3 is a surface region A in the insert 1 of the present disclosure.

A region which includes the surface region A and is located within 0.5 mm from the surface region A is a region A1 in the insert 1 of the present disclosure. The region A1 is located from the region A to the inside of the base 9. A region within 1.2 mm from the surface region A and the second surface to 2.0 mm from the surface region A and the second surface is a region A2. The region A2 is located more interior in the base 9 than the region A1. An area ratio of vacancies (not illustrated) in the region A1 is 0.005-0.04 area %, and an area ratio of vacancies (not illustrated) in the region A2 is 0.05-0.2 area % in the insert 1 of the present disclosure. As used herein, the term "area ratio" can also be referred to as an occupancy rate in a predetermined area, and can be rephrased as an area occupancy.

The configuration described above leads to excellent fracture resistance of the insert 1 of the present disclosure.

The region A2 located in the interior of the base 9 includes more vacancies than the region A1 in the insert 1 of the present disclosure. The base 9 has improved toughness and hardness as a whole because a vacancy rate of the region A2 is 0.05-0.2 area %.

Because a vacancy rate is 0.005-0.04 area % in the region A1 located in the vicinity of the surface of the base 9, the region A1 has higher hardness than cases where vacancies exceeding 0.04 area % are present in the region A1. The region A1 is less prone to fracture than cases where the vacancy rate of the region A1 is less than 0.005 area %.

The insert 1 of the present disclosure may include vacancies of 0.005-0.04 area % in a region at more than 0.5 mm and less than 1.2 mm below the surface of the base 9.

An average diameter of the vacancies in the region A1 may be smaller than an average diameter of the vacancies in the region A2. This configuration contributes to enhanced strength of the region A1, thus leading to excellent fracture resistance.

The average diameter of the vacancies in the region A1 may be 1.5 μm or less. This configuration particularly contributes to enhanced strength of the region A1, thus leading to the excellent fracture resistance.

An average diameter of the vacancies in the region A2 may be 2 μm or less. With this configuration, the base 9 has enhanced toughness and hardness as a whole.

Alternatively, the insert 1 of the present disclosure may include a region A3 between the region A1 and the region A2, namely, a region at more than 0.5 μm from the surface region A and located at between the surface region A and the second region A2. The region A3 may include vacancies (not illustrated). An area ratio of the vacancies in the region A3 may be larger than the area ratio of the vacancies in the region A1, and may be smaller than the area ratio of the vacancies in the region A2.

This configuration ensures that the area ratio of the vacancies in the insert 1 changes moderately. This leads to a moderate change in characteristics of the base 9, and the insert 1 has more excellent fracture resistance.

The area ratio of vacancies in a region within 0.5 mm from the second surface may be similar to that in the region A1 in the insert 1 of the present disclosure. This configuration leads to high hardness of the region within 0.5 mm from the second surface.

Examples of material constituting the base 9 in the insert 1 of the present disclosure may include hard alloys, ceramics and metals. Examples of the hard alloys may include cemented carbides containing tungsten carbide (WC), and iron group metal such as cobalt (Co) and nickel (Ni). Other hard alloys may be Ti-based cermet containing titanium carbonitride (TiCN), and iron group metal such as cobalt (Co) and nickel (Ni). The ceramics may be $Si_3N_4$, $Al_2O_3$, diamond, or cubic boron nitride (cBN). The metals may be carbon steel, high-speed steel or alloy steel. Of these materials, cemented carbide or cermet is preferably used for the base 9 in terms of fracture resistance and wear resistance in the application to the insert 1.

The insert 1 of the present disclosure may further include a coating layer (not illustrated) on the surface of the base 9. The coating layer contributes to enhanced wear resistance of the insert 1. If including the coating layer, it is of course that at least a part of a region where the coating layer along the first surface 3 intersects with the coating layer along the second surface 5 serves as the cutting edge 7.

The coating layer may be a single layer or a laminated film obtained by laminating a plurality of layers one upon another. The coating film may be a so-called diamond film, DLC film, TiN film, TiCN film, $Al_2O_3$ film, or alternatively, one obtained by combining these films.

The area ratio of the vacancies in the individual regions of the base 9 is measurable by subjecting a cross section perpendicular to the surface of the base 9 to mirror finishing, followed by observation with a metal microscope and an electron microscope. Although it depends on the size of vacancies, it may be preferable to measure at a magnification of 500 times. A measurement area in the individual regions may be preferably 0.03-0.09 $mm^2$.

If the first surface 3 is the so-called rake surface in the insert 1 of the present disclosure, the second surface 5 is the flank surface, and one which is located on an intersection of these two surfaces is the cutting edge 7. The insert 1 is used in a cutting process by bringing the cutting edge 7 into contact with a workpiece, and has excellent fracture resistance. The insert 1 of the present disclosure is applicable to, besides the cutting tools, various kinds of uses, for example, digging tools, tools such as blades, and impact resistant components. Also in these cases, the insert 1 may offer excellent mechanical reliability.

An embodiment of a method for manufacturing the insert 1 of the present disclosure is described below.

Firstly, a mixed powder is prepared by suitably adding metal powder, carbon powder or the like to an inorganic powder of carbide, nitride, carbonitride, oxide or the like, which are capable of forming a hard alloy that becomes a base by sintering, and then by mixing them together. Subsequently, with a known molding method, such as press molding, casting molding, extrusion molding or cold isostatic pressing, the mixed powder is molded into a predetermined tool shape. The base is manufactured by sintering an obtained molded body in a vacuum or a non-oxidizing atmosphere.

The base in the insert of the present disclosure may be manufactured by, for example, mixing resin spheres having a diameter of approximately 0.5-20 μm to the above mixed powder.

The method includes the following steps: incorporating the resin spheres in an amount of, for example, 0.06-0.24 vol % to the molded body (hereinafter also referred to as a second molded body) which becomes the region A2 in the base after sintering; covering a surface of the second molded body with the mixed powder including 0.01-0.05 vol % of the resin spheres having a thickness of approximately 0.7-1.4 mm; and pressurizing and integrating the molded body and the mixed powder covering the surface thereof. This results in a composite molded body in which a molded body (hereinafter also referred to as a first molded body), which becomes the region A1 after sintering, is located on the surface of the second molded body, thereby obtaining the composite molded body in which an abundance of the resin spheres differs depending on position. The insert 1 of the present disclosure is manufacturable by sintering the composite molded body.

A surface of the molded body that becomes the region A2 after sintering may be covered with the mixed powder that becomes the region A3 after sintering, and may be further covered with the mixed powder that becomes the region A1 after sintering. In this case, a smaller amount of the resin spheres may be added to the mixed powder that becomes the region A3 after sintering than the resin spheres added to the mixed powder that becomes the region A2 after sintering.

The above combination makes it possible to manufacture the insert 1 which has the largest area ratio of vacancies in the region A2 and has the second largest area ratio of vacancies in the region A3.

Although the first molded body including the resin spheres is used in the above embodiment, the first molded body may not include the resin spheres if the ratio of the vacancies in the region A1 is designed to fall within the range described in the present invention depending on the sintering conditions.

With the manufacturing method using the resin spheres as described above, it is possible to arrange the vacancies at desired positions and desired area ratios.

On the sintering of the molded body thus manufactured, firstly, binder components may be removed by heating the molded body in the so-called debinding process, and the resin spheres may be then removed by increasing temperature. Thereafter, the sintering may be carried out under conditions, for example, 1350-1600° C. in an Ar atmosphere.

A surface of the base thus manufactured may be subjected to polishing, and the cutting edge part may be subjected to honing if desired.

Subsequently, a coating layer may be deposited on the surface by, for example, chemical vapor deposition (CVD) method.

The following is an embodiment where the coating layer is formed on the surface of the base. The first step is to deposit a TiN layer that is an underlayer by putting the base in a chamber. Deposition is carried out at a deposition temperature of 830° C. and a gas pressure of 8 kPa by using a reaction gas whose composition is 0.1-20 vol % of titanium tetrachloride ($TiCl_4$) gas, 20 vol % of nitrogen ($N_2$) gas, and the rest, namely, hydrogen ($H_2$) gas.

The next step is to deposit a first layer that is a TiCN layer. Deposition is carried out at a deposition temperature of 830° C. and a gas pressure of 9 kPa by using a reaction gas whose composition is 5.0-20 vol % of titanium tetrachloride ($TiCl_4$) gas, 10-90 vol % of nitrogen ($N_2$) gas, 0.3-3.0 vol % of acetonitrile ($CH_3CN$) gas, and the rest, namely, hydrogen ($H_2$) gas. By increasing a content ratio of acetonitrile ($CH_3CN$) gas at a late stage than an early stage during the deposition, an average crystal width of titanium carbonitride columnar crystals constituting the first TiCN layer can be made larger on a side of the surface than on a side of the base. The first layer has a thickness of 1 μm or more. The first layer may have a thickness of 3-20 μm.

The next step is to deposit a first intermediate layer that is a TiCN layer. Deposition is carried out at a deposition temperature of 950° C. and a gas pressure of 9 kPa by using a reaction gas whose composition is 10-20 vol % of titanium tetrachloride ($TiCl_4$) gas, 0.5-10 vol % of methane ($CH_4$) gas, 10-70 vol % of nitrogen ($N_2$) gas, and the rest, namely, hydrogen ($H_2$) gas. The first intermediate layer has a thickness of less than 1 μm.

The next step is to deposit a second intermediate layer that is a TiCNO layer. Deposition is carried out at a deposition temperature of 950° C. and a gas pressure of 9 kPa by using a reaction gas whose composition is 10-20 vol % of titanium tetrachloride ($TiCl_4$) gas, 0.5-10 vol % of methane ($CH_4$) gas, 10-20 vol % of nitrogen ($N_2$) gas, 0.1-3.0 vol % of carbon monoxide (CO) gas, and the rest, namely, hydrogen ($H_2$) gas. The second intermediate layer has a thickness of less than 1 μm. A sum of the first intermediate layer and the second intermediate layer is less than 1 μm.

Deposition of a second layer that is an $Al_2O_3$ layer is carried out at a deposition temperature of 980-1100° C. and a gas pressure of 5-20 kPa by using a reaction gas whose composition is 5-20 vol % of aluminum trichloride ($AlCl_3$) gas, 2-8 vol % of hydrogen chloride (HCl) gas, 3-8 vol % of carbon dioxide ($CO_2$) gas, 0.001-0.01 vol % of hydrogen sulfide ($H_2S$) gas and the rest, namely, hydrogen ($H_2$) gas. The second layer may have a thickness of 1-15 μm.

Subsequently, deposition of a TiN layer that is an uppermost layer and a third layer is carried out at a deposition temperature of 1010° C. and a gas pressure of 10 kPa by using a reaction gas whose composition is 0.06-5 vol % of titanium tetrachloride ($TiCl_4$) gas, 10-30 vol % of nitrogen ($N_2$) gas, and the rest, namely, hydrogen ($H_2$) gas. The third layer may have a thickness of 0.1-2 μm.

Although the embodiment including the first intermediate layer, the second intermediate layer and the third layer has been discussed above, the first layer that is the TiCN layer, and the second layer that is the $Al_2O_3$ layer may be laminated directly on the surface of the base.

While the inserts 1 of the present disclosure have been described, the present disclosure is not limited to the above embodiments, and various improvements and changes may be made without departing from the spirit and scope of the present disclosure.

<Cutting Tools>

A cutting tool of the present disclosure is described below with reference to the drawings.

Figure 3:
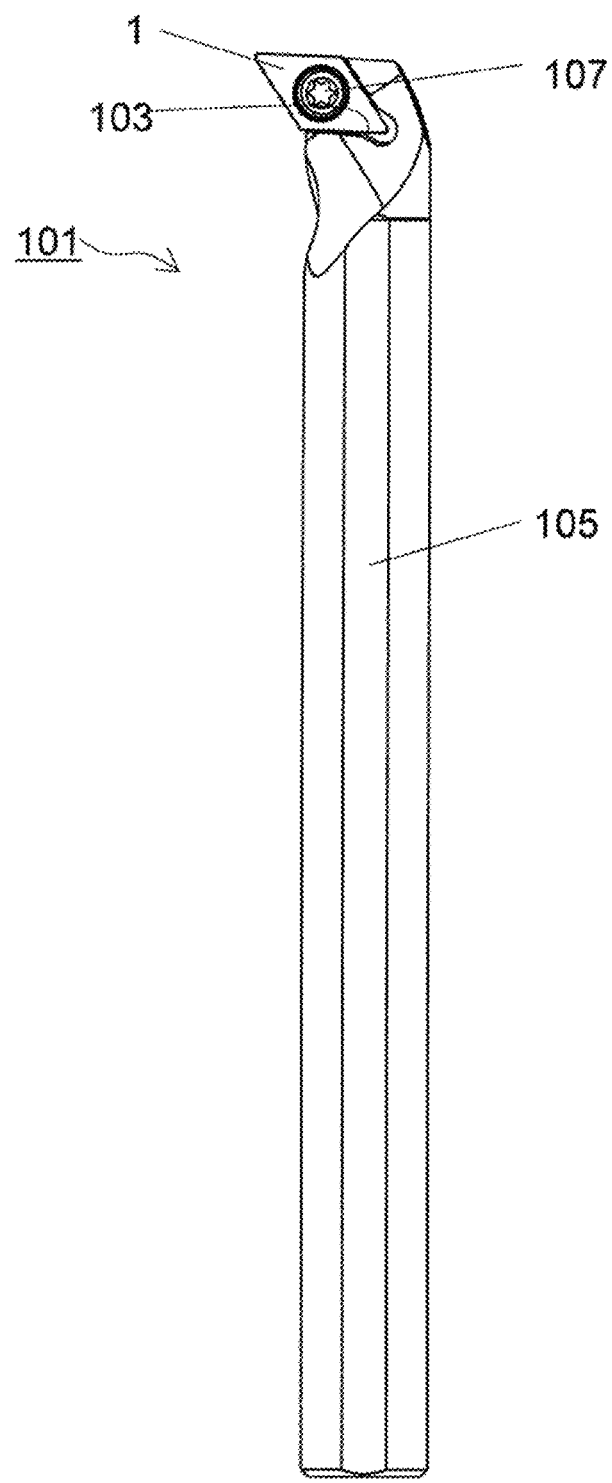
FIG. 3 is a plan view illustrating an embodiment of cutting tools in the present disclosure.

As illustrated in FIG. 3, the cutting tool 101 of the present disclosure is, for example, a bar-shaped body extended from a first end (an upper end in FIG. 3) toward a second end (a lower end in FIG. 3). As illustrated in FIG. 3, the cutting tool 101 includes a holder 105 with a pocket 103 located on a side of the first end (a tip), and the insert 1 located in the pocket 103. The cutting tool 101 includes the insert 1 and is therefore capable of carrying out a stable cutting process for a long period of time.

The pocket 103 is a part that permits attachment of the insert 1. The pocket 103 includes a seating surface parallel to a lower surface of the holder 105, and a constraining side surface inclined relative to the seating surface. The pocket 103 opens into a side of the first end of the holder 105.

The insert 1 is located in the pocket 103. A lower surface of the insert 1 may be in a direct contact with the pocket 103. Alternatively, a sheet (not illustrated) may be held between the insert 1 and the pocket 103.

The insert 1 is attached so that at least a part of a ridgeline where the first surface 3 intersects with the second surface 5, which is usable as the cutting edge 7, is protruded outward from the holder 105. The insert 1 is attached to the holder 105 by a screw 107 in the present embodiment. Specifically, the insert 1 is attached to the holder 105 in such a manner that screw parts are engaged with each other by inserting the screw 107 into the through hole 17 of the insert 1, and by inserting a front end of the screw 107 into a screw hole (not illustrated) formed in the pocket 103.

For example, steel and cast iron are usable as a material of the holder 105. Of these materials, highly rigid steel may be used.

The present embodiment has illustrated and described the cutting tool 101 for use in a so-called turning process. Examples of the turning process include inner diameter processing, outer diameter processing and grooving process. The cutting tool 101 is not limited to one which is used for the turning process. For example, the insert 1 of the above embodiments may be used for cutting tools used in a cutting process by rolling.

EXAMPLES

Firstly, 6 mass % of metal cobalt powder having a mean particle diameter of 1.2 μm, 0.5 mass % of titanium carbide powder having a mean particle diameter of 2.0 μm, 5 mass % of niobium carbide powder having a mean particle diameter of 2.0 μm, and the rest, namely, tungsten carbide powder having a mean particle diameter of 1.5 μm were added and mixed together in their respective amounts. As a result, a mixed powder was prepared.

Additionally, a second molded body that becomes the region A2 after sintering was formed by adding resin spheres, whose mean particle diameter and amount are presented in Table 1, to the mixed powder. The mixed powder including no resin sphere was used for Samples in which neither a mean particle diameter nor amount is presented in Table 1.

Subsequently, a composite molded body was manufactured in which the first molded body that becomes the region A1 after sintering was formed over the whole surface of a surface of the second molded body.

These molded bodies were molded into a tool shape (CNMG120408).

Thereafter, a debinding process was carried out to further remove the resin spheres, followed by sintering in a vacuum at 1500° C. and 0.01 Pa for one hour, thereby manufacturing a base composed of cemented carbide. Thereafter, the manufactured base was subjected to brushing, and a part of the base, serving as a cutting edge, was subjected to round honing.

Subsequently, the insert including a coating layer was manufactured by sequentially depositing, on the base of the cemented carbide, a TiN layer, a TiCN layer, a TiCNO layer, an $Al_2O_3$ layer, and a TiN layer from a side of the base by chemical vapor deposition (CVD) method.

Area ratios of vacancies in the regions A1 and A2 and average diameters of the vacancies were measured in the above samples by SEM observation of a cross section including the coating layer. The measurement was made in an area of 0.04 $mm^2$ at a magnification of 500 times.

Specifically, the cross section of the base subjected to mirror polishing was photographed with a metal microscope at a magnification of 500 times, and an image analysis of image data was performed using an image software "Mac-View" (Version 4, manufactured by MOUNTECH Co., Ltd.). As to particle detection and determination conditions in the image, acquisition mode was an aspheric form, and detection sensitivity was 20. Detection accuracy was standard (0.7). As to particle operating conditions, scanning density was standard, and scanning number is one. Obtained area ratios of vacancies are presented in Table 1.

Fracture resistance of the inserts manufactured under the above conditions was evaluated by conducting an intermittent cutting test under the following conditions. Test results are presented in Table 1.

<Intermittent Cutting Conditions>
   Workpiece: SCM440 round rod with four grooves (0200 mm×450 mm)
   Tool Shape: CNMG120412
   Cutting Speed: 200 m/min
   Feed: 0.3 mm/rev
   Depth of Cut: 1.5 mm
   Others: Using water-soluble cutting fluid
   Evaluation Item: The number of impacts until a fracture occurs

TABLE 1

| Sample No. | Second molded body | | First molded body | | Region A2 Area raio of vacancies (%) | Region A1 Area raio of vacancies (%) | Fracture resistance (Number of impacts until fracture) |
|---|---|---|---|---|---|---|---|
| | Volume ratio of resin spheres (%) | Average diameter of resin spheres (μm) | Volume ratio of resin spheres (%) | Average diameter of resin spheres (μm) | | | |
| 1 | — | — | — | — | 0.033 | 0.003 | 5302 |
| 2 | 0.05 | 2.00 | 0.01 | 2.00 | 0.040 | 0.005 | 6586 |
| 3 | 0.06 | 2.00 | 0.01 | 2.00 | 0.050 | 0.005 | 7666 |
| 4 | 0.11 | 2.00 | 0.01 | 2.00 | 0.091 | 0.005 | 8868 |
| 5 | 0.16 | 2.00 | 0.01 | 2.00 | 0.127 | 0.005 | 9026 |
| 6 | 0.20 | 2.00 | 0.01 | 2.00 | 0.162 | 0.005 | 8701 |
| 7 | 0.24 | 2.00 | 0.01 | 2.00 | 0.200 | 0.005 | 8200 |
| 8 | 0.25 | 2.00 | 0.01 | 2.00 | 0.210 | 0.005 | 6778 |
| 9 | 0.2 | 2.00 | 0.015 | 2.00 | 0.162 | 0.010 | 8220 |
| 10 | 0.2 | 2.00 | 0.02 | 2.00 | 0.162 | 0.020 | 9127 |
| 11 | 0.2 | 2.00 | 0.025 | 2.00 | 0.162 | 0.025 | 9800 |
| 12 | 0.2 | 2.00 | 0.03 | 2.00 | 0.162 | 0.030 | 9200 |
| 13 | 0.2 | 2.00 | 0.035 | 2.00 | 0.162 | 0.040 | 7388 |
| 14 | 0.05 | 2.00 | 0.04 | 4.00 | 0.162 | 0.041 | 6702 |
| 15 | 0.06 | 2.00 | 0.05 | 2.00 | 0.050 | 0.040 | 7441 |
| 16 | 0.11 | 2.00 | 0.05 | 2.00 | 0.091 | 0.040 | 8834 |
| 17 | 0.16 | 2.00 | 0.05 | 2.00 | 0.127 | 0.040 | 9001 |
| 18 | 0.20 | 2.00 | 0.05 | 2.00 | 0.162 | 0.040 | 8300 |
| 19 | 0.24 | 2.00 | 0.05 | 2.00 | 0.200 | 0.040 | 7850 |
| 20 | 0.24 | 2.00 | 0.06 | 2.00 | 0.200 | 0.050 | 6388 |
| 21 | 0.25 | 2.00 | 0.06 | 2.00 | 0.210 | 0.040 | 6431 |

As presented in Table 1, Samples Nos. 3-7, 9-13 and 15-19, each being the insert of the present disclosure, were excellent in fracture resistance.

The invention claimed is:

1. An insert, comprising:
a base comprising a first surface, a second surface connecting to the first surface, and a cutting edge located on at least a part of a ridgeline of the first surface and the second surface, wherein
a region within 2.0 mm from the cutting edge in the first surface is a surface region A, a region which comprises the surface region A and is within 0.5 mm from the surface region A is a region A1, and a region within 1.2 mm from the surface region A and the second surface to 2.0 mm from the surface region A and the second surface is a region A2, and
an area ratio of vacancies in the region A1 is 0.005-0.04 area %, and an area ratio of vacancies in the region A2 is 0.05-0.2 area %.

2. The insert according to claim 1, wherein an average diameter of the vacancies in the region A1 is smaller than an average diameter of the vacancies in the region A2.

3. The insert according to claim 1, wherein an average diameter of the vacancies in the region A1 is 1.5 μm or less.

4. The insert according to claim 1, wherein an average diameter of the vacancies in the region A2 is 2 μm or less.

5. The insert according to claim 1, further comprising a coating film covering at least a part of the base.

6. A cutting tool, comprising:
a holder which has a length ranging from a first end to a second end and comprises a pocket located on a side of the first end; and
the insert according to claim 1, the insert being located in the pocket.

* * * * *